United States Patent
Meiring et al.

(10) Patent No.: US 9,223,911 B2
(45) Date of Patent: Dec. 29, 2015

(54) OPTICAL MODEL EMPLOYING PHASE TRANSMISSION VALUES FOR SUB-RESOLUTION ASSIST FEATURES

(71) Applicant: GLOBALFOUNDRIES INC., Grand Cayman (KY)

(72) Inventors: Jason E. Meiring, New Fairfield, CT (US); Mohamed Talbi, Hopewell Junction, NY (US); Ramya Viswanathan, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 69 days.

(21) Appl. No.: 14/168,133

(22) Filed: Jan. 30, 2014

(65) Prior Publication Data

US 2015/0213161 A1     Jul. 30, 2015

(51) Int. Cl.
*G06F 17/50*     (2006.01)

(52) U.S. Cl.
CPC ........ *G06F 17/5009* (2013.01); *G06F 17/5068* (2013.01)

(58) Field of Classification Search
CPC .......................... G06F 17/5009; G06F 17/5068
USPC .......................................................... 716/53
See application file for complete search history.

(56) References Cited

U.S. PATENT DOCUMENTS

| | | | |
|---|---|---|---|
| 6,887,633 B2 | 5/2005 | Tang | |
| 7,008,732 B2 | 3/2006 | Lin et al. | |
| 7,122,453 B2 | 10/2006 | Baggenstoss | |
| 7,318,214 B1 * | 1/2008 | Prasad et al. | 716/53 |
| 7,550,235 B2 | 6/2009 | Shi et al. | |
| 7,617,473 B2 | 11/2009 | Liebmann et al. | |
| 7,673,277 B2 | 3/2010 | Tang | |
| 7,799,487 B2 | 9/2010 | Hamouda | |
| 8,084,169 B2 | 12/2011 | Hamouda | |
| 8,108,806 B2 | 1/2012 | Robles et al. | |
| 2005/0262467 A1 * | 11/2005 | Croffie | 716/19 |

* cited by examiner

*Primary Examiner* — Jack Chiang
*Assistant Examiner* — Brandon Bowers
(74) *Attorney, Agent, or Firm* — Scully, Scott, Murphy & Presser, P.C.

(57) ABSTRACT

Optical simulation can be performed employing a calibrated printing model, in which a unique phase transmission value is assigned to each type of sub-resolution assist features (SRAFs). The printing model can be calibrated employing a mask including multiple test patterns. Each test pattern is defined by a combination of a main feature, at least one SRAF applied to the main feature, and the geometrical relationship between the main feature and the at least one SRAF. Generation of the phase transmission values for each SRAF can be performed by fitting a printing model employing phase shift values and/or transmission values for SRAFs with measured printed feature dimensions as a function of defocus and/or with measured SRAF printing behavior on a printed photoresist layer. A properly calibrated printing model can predict the printed feature dimensions, shift in the best focus, and presence or absence of printed SRAFs.

20 Claims, 5 Drawing Sheets

OPTICAL MODEL EMPLOYING PHASE TRANSMISSION VALUES FOR SUB-RESOLUTION ASSIST FEATURES

BACKGROUND

The present disclosure relates to a method of providing a lithography model, and particularly to a method of calibrating a sub-resolution assist feature (SRAF) printing model.

Images printed on a photoresist for an isolated lithographic pattern are more sensitive to focus variations than images for a dense lithographic pattern. Focus-exposure matrix (FEM) curves are thus more isofocal for dense lithographic patterns. Hence, dense lithographic patterns can be printed with a critical dimension (CD) that remains within tolerances for a broader range of defocus conditions.

Sub-resolution assist features (SRAFs) are added to mask shapes to create a denser environment for robust printing of main features. The SRAFs are not intended to be reproduced as distinct features in the photoresist, but they influence and modify the exact shape with which the main features are printed in the photoresist in the presence of the SRAFs relative to shapes that would be printed in the absence of the SRAFs. In order to avoid direct printing of the SRAFs, the size and location of the SRAFs need to be carefully optimized. If properly optimized, the SRAFs can provide benefit to the process performance of the lithographic process, for example, by increasing the depth of focus or process window, while avoiding direct printing of the SRAFs as separate but unintended patterns that could transfer to subsequent steps of the chip manufacturing process.

SRAFs are commonly used in lithography masks to improve the printability and process window of critical features. The SRAFs are placed as part of an overall data preparation program that includes a model based optical proximity correction (OPC) algorithm for all incoming design patterns that are placed on a lithographic mask. SRAFs are very challenging to model accurately because by nature the SRAFs are designed not to generate a directly corresponding pattern in a photoresist layer. An accurate SRAF model is supposed to correctly predict the effects that the SRAFs have on the main feature(s) including any shift in the best focus, and any undesirable printing of direct images of the SRAFs at the top, or the bottom, of the photoresist.

The process models used to implement the OPC algorithms are two-dimensional in nature, in that the process models only predict the shapes of printed features at a specific height (typically the bottom) in the photoresist or substrate. Typically, clear SRAF printing tends to occur at the top of the photoresist layer, and will not be detected by a process model calibrated to only predict printing at the bottom of the photoresist layer. In contrast, dark SRAF printing tends to occur at the bottom of the photoresist layer, and the calibrated resist threshold for showing presence of the dark SRAF printing might be set too high to detect the dark SRAF printing at the first sign of physical manifestation in the lithographically exposed and developed photoresist layer.

One solution to this problem is to set the exposure dose much higher (for clear SRAFs), or lower (for dark SRAFs), than the nominal dose to exaggerate the optical effects of the SRAFs on the photoresist layer. However, this strategy does not typically detect all instances of SRAF printing, and the change in main feature printing may obscure the SRAF printing behavior. Another solution is to use a full three-dimensional model of the photoresist layer, but three-dimensional models tend to require excessive computing, and thus, not suitable for manufacturing purposes. Further, the three-dimensional models also require additional calibration separate from the calibration of the two-dimensional models, and can result in inconsistent predictions if not properly calibrated. A third solution is to calibrate a separate two-dimensional model that is tuned to predict SRAF printing while sacrificing main feature prediction accuracy. These models are difficult to calibrate since such models must predict both printing and absence of printing, while the input data can only include the former.

Another challenge with modeling SRAFs is that the small size of the SRAFs can lead to inaccurate optical simulations when using the thin mask approximation (TMA), in which the mask absorber is assumed to be infinitely thin. This approximation speeds computation time but the approximation starts to break down as the width of the feature starts to approach the thickness of the absorber. The so-called electromagnetic field (EMF) effects introduce transmission and phase offsets into the optics. The EMF effects can cause the best focus of the main feature to shift depending on the placement and tone of the SRAFs.

SUMMARY

Optical simulation can be performed employing a calibrated printing model, in which a unique phase transmission value is assigned to each type of sub-resolution assist features (SRAFs). The printing model can be calibrated employing a mask including multiple test patterns. Each test pattern is defined by a combination of a main feature, at least one SRAF applied to the main feature, and the geometrical relationship between the main feature and the at least one SRAF. Generation of the phase transmission values for each SRAF can be performed by fitting a printing model employing phase shift values and transmission values for SRAFs with measured printed feature dimensions as a function of defocus and/or with measured SRAF printing behavior on a printed photoresist layer. A properly calibrated printing model can predict the printed feature dimensions, shift in the best focus, and presence or absence of printed SRAFs.

According to an aspect of the present disclosure, a method of generating a model for optical simulation is provided. A test mask including multiple test patterns therein is provided. Each test pattern includes a plurality of combinations of a main feature and at least one sub-resolution assist feature (SRAF). Photoresist layers are lithographically exposed, employing the test mask, at different focus conditions, and are subsequently developed. Printed feature dimensions of the test pattern on the developed photoresist layers are measured. A table including a phase transmission value for each SRAF in the test pattern is generated by fitting a printing model with the printed feature dimensions. A model for optical simulation is generated. The model includes the printing model and the table of phase transmission values.

According to another aspect of the present disclosure, a method of performing an optical simulation on a design layout is provided. A model for optical simulation is provided employing a method of described above. A design layout is provided. An optical simulation can be run on the design layout employing the model for optical simulation.

DETAILED DESCRIPTION

Figure 1:
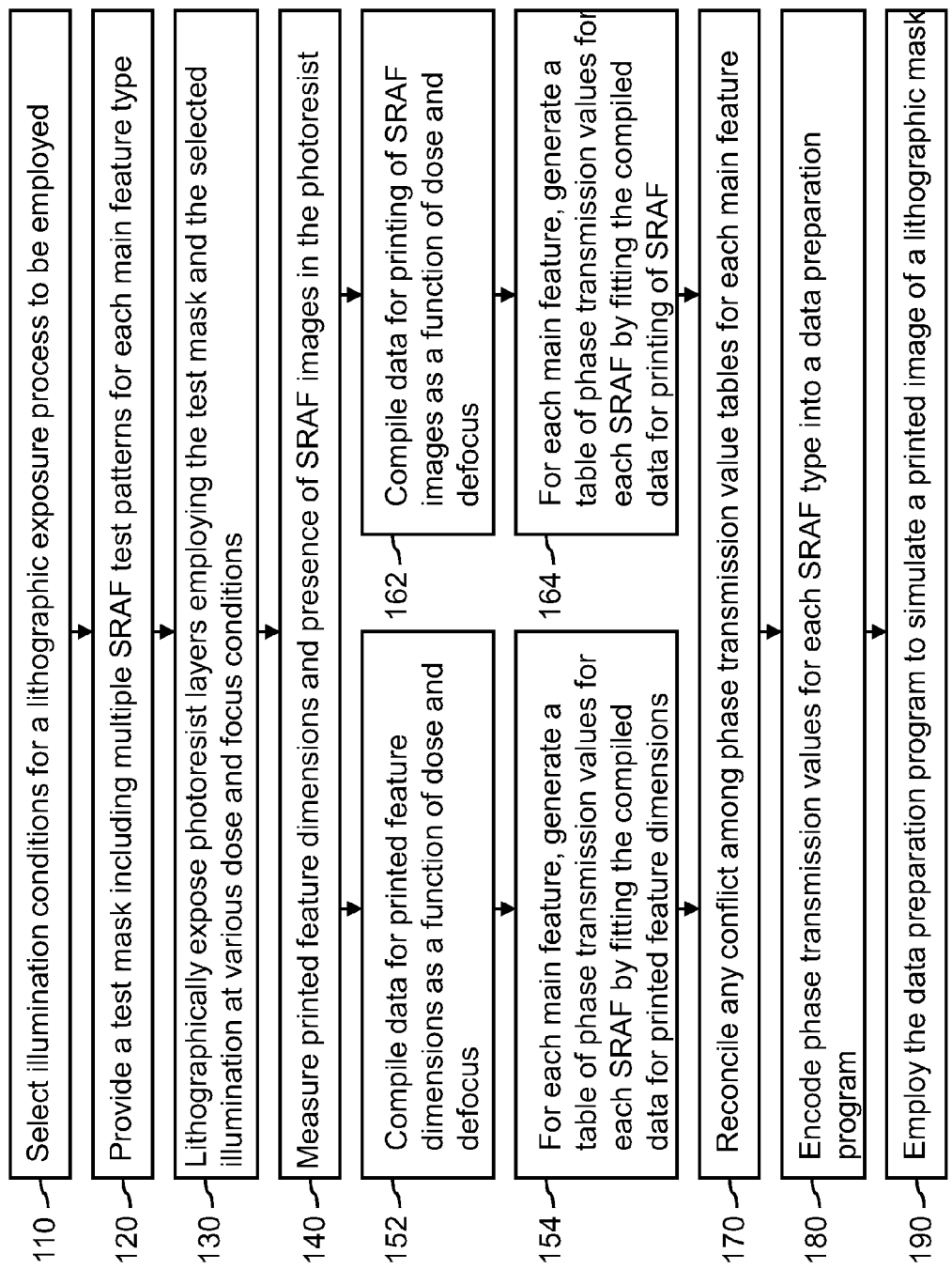
FIG. 1 is a flow chart illustrating a set of steps that can be employed to implement an embodiment of the present disclosure.

As stated above, the present disclosure relates to a method of calibrating a printing model, which is now described in detail with accompanying figures. Like and corresponding elements mentioned herein and illustrated in the drawings are referred to by like reference numerals. The drawings are not necessarily drawn to scale.

As used herein, a "main feature" refers to a portion of the mask pattern that is intended for printing in a photoresist layer, i.e., intended for lithographically exposing the photoresist material on a wafer with sufficient illumination intensity to react with the photo-sensitive photoresist material. In the case of a photoresist layer including a positive photoresist material, the lithographically exposed portions of the photoresist layer become soluble to the developer solution and are removed when the developer is applied. In the case of a photoresist layer including a negative photoresist material, the lithographically exposed portions of the photoresist layer become insoluble to the developer solution and unexposed portions of the photoresist layer are removed when the developer is applied. A main feature is a resolvable feature that causes incident radiation to illuminate the photoresist with enough intensity so that the resolvable feature is developed away through the entire or nearly the entire thickness of the photoresist.

As used herein, a "sub-resolution assist feature (SRAF)" refers to a portion of the mask pattern that is intended to enhance the printing of a main feature without producing a physically manifested pattern in a photoresist layer that is printed as a result of the presence of the SRAF alone. The robustness of the main feature printing performance when affected by process variations such as focus or dose is enhanced by SRAFs. However, the intensity of the image of the SRAFS at the wafer plane is kept below the threshold for inducing a sufficient chemical reaction in the photoresist. Ideally, an image of an SRAF should not be present in an exposed photoresist layer in order to avoid impacting subsequent steps such as etch and deposition, and ultimately causing the manufactured chip to fail.

A design layout can be transferred from a lithographic mask to a photoresist layer coated on a substrate (i.e., a wafer) by etching design shapes on the lithographic mask, illuminating the lithographic mask with radiation, and focusing the diffraction from the lithographic mask onto the photoresist layer via a system of lenses. To enhance resolution and robustness to focus deviations of the image intensity distribution on the photoresist layer, SRAFs are added to the lithographic mask as additional features or shapes. The SRAFs are not intended to be resolved in the photoresist layer. Shape and placement of the SRAFs must be optimized to provide the maximum benefit without resolving on the photoresist layer. Ideally, an SRAF should not even marginally resolve in the form of small indentations on the surface of the photoresist layer or small resist bumps on the substrate surface because even such small indentations or bumps could be transferred into the substrate in subsequent etch processes that employ the patterned photoresist layer as an etch mask.

As used herein, a "printing sub-resolution assist feature" or a "printing SRAF" refers to any visible indentation in a photoresist surface or resist bumps on a substrate surface directly caused by the presence of an SRAF on the lithographic mask.

As used herein, a "dimpling" refers to a small depression or indentation on the photoresist surface that arise as a consequence of using mask patterns that are not intended to be resolved in the photoresist but that can produce a hollow perforation of the photoresist and this perforation is deemed detrimental to the lithographic process. This indentation occurs as the image intensity produced by this sub-resolution mask pattern marginally approaches the photoresist intensity threshold that triggers a chemical reaction that turns the photosensitive photoresist material soluble to the developer solution for positive resist or insoluble to the developer solution for negative resists.

As used herein, a "lithography process model" or a "lithography model" is a set of equations that are numerically computed, comprising at least an optical model and a resist model. The optical model is applied first, to simulate the light diffracted by the lithographic photomask when illuminated by a monochromatic light source, and simulate how this diffracted light distribution is collected and imaged through the lithography tool optical system, comprising a system of lenses and/or mirrors, onto the wafer surface. The optical model is thus used to determine the light intensity distribution that is produced on the wafer surface by the lithography optical system. The photoresist model is used second, to compute, from that image intensity distribution, a photoresist topography remaining after a photoresist material chemically reacts to the image light intensity above a certain threshold to become soluble or insoluble, depending on photoresist polarity, to a developer solution, and is subsequently washed with said developer solution.

A lithography process model can include only a main feature lithography model or a set of a main feature lithography model and a printing model.

As used herein, an "optical model" refers to a model within a lithography process model and contains a set of equations that describe the illumination and diffraction from a lithographic mask, and the propagation and imaging onto photoresist film of said diffracted light through the lithographic scanner system of lenses and/or mirrors.

An optical model computes the intensity distribution of the aerial image at the wafer plane. The computation of the intensity distribution of the aerial image at the wafer plane can be effected by employing the shapes on a lithographic mask, the configuration of the illuminating source, the projection optics design, and other parameters of the optical system such as numerical aperture which are fixed from the stepper/scanner.

A lithography simulator takes the mask shapes, i.e., the shapes within the lithographic mask, as inputs, and computes the light diffracted from the lithographic mask when it is illuminated by the source. The lithography simulator then computes using ray-tracing theory how the diffracted wavefront is directed through the complex lens system of the scanner towards the wafer surface. At the wafer surface, the lithography simulator computes the distribution of the image intensity inside the photoresist layer through the optical interference of all propagating rays collected by the numerical aperture of the optical system, ignoring any chemical effect inside the photoresist (since chemical effects are modeled by a photoresist model).

An optical model can be described as a set of equations and algorithms to numerically compute the diffraction from a lithographic mask, which may contain main features (resolvable features) and sub-resolution assist features, the propagation of the diffracted light field through the scanner projection lens system, and the aerial image the lens system projects onto a photoresist layer on a substrate, which can be a wafer as known in the art.

As used herein, a "main feature model," a "main feature process model," a "main feature lithography process model," an "optical proximity correction model," or an "OPC model" refers to a lithography process model that predicts photoresist contours corresponding to the presence of main features within a layout of a lithographic mask.

A main feature model predicts the photoresist contours at a single plane or height of the photoresist topography as seen from a top-down view. A main feature model can be used in full-chip compatible optical proximity correction algorithms. A main feature model can be compatible with simulations at a full-chip scale. A main feature model can be calibrated to, and aim to, predict the photoresist contours due to resolvable features of the layout.

Full-chip compatible main feature models are capable to predict the photoresist contours of resolvable features at a single photoresist plane with sufficient accuracy and sufficient speed that can be applied on an entire micro-chip layout with billions of patterns with adequately fast turnaround time for chip manufacturing.

A main feature model can be used to apply corrections on mask shapes. The corrections pre-compensate for systematic and known distortions induced by the lithographic process employed to form final shapes that are printed on a photoresist on a wafer. The parameters for the lithographic process include optics and photoresist chemistry.

The distortions printed on the photoresist include effects of the optical system (such as diffraction and aberrations) and effects due to the chemistry of the photoresist (such as diffusion, acid reaction). A main feature model includes at least a pair of an optical model and a photoresist model that is used to compute the photoresist contours corresponding to the main feature. Hence, a main feature model is typically provided in two steps. First, an optical model is employed to simulate how light is diffracted from a mask and subsequently propagates through the imaging system of a scanner until the light is focused inside the photoresist layer. Second, a photoresist model is employed to simulate how the image intensity distribution inside the photoresist layer changes the chemistry of the photoresist material to produce topography with contours that resemble the target pattern. The aerial image is employed as an input for the photoresist model.

As used herein, "optical model parameters" refer to parameters in an optical model. The computation of the image intensity inside a photoresist layer requires information on the location of the best focus plane. In addition, each computation of critical dimension values or photoresist contours is done at a fixed height within the photoresist layer, resulting in a two-dimensional representation of the resist topography. Hence which horizontal plane is to be employed as the image or simulation plane needs to be determined.

Most of the parameters of the optical system (source, lens aberrations, and numerical aperture, etc.) are fixed by the stepper specifications. In some embodiments, the only parameters that need to be optimized or calibrated are the value of the best focus plane and the value of the image plane.

As used herein, a "best focus plane" or a "plane of best focus" is a parameter of an optical model and refers to the plane at which the image of the features on a lithographic mask is focused with maximum sharpness. The best focus plane can be defined relative to a photoresist top surface or a photoresist bottom surfaces, depending on the model conventions.

As used herein, an "image plane" or a "simulation plane" refers to a plane at which the computation of both the aerial image intensity and the photoresist topography contours in a lithography process model is performed. The computation is performed at one plane or height, which is an image plane, within the photoresist thickness at a time. In the case of OPC models, the photoresist contours are computed only at one plane or height within the photoresist thickness. Hence the value of the height of the image plane needs to be defined for the purpose of each computation.

As used herein, a "photoresist model" refers to the equation or set of equations describing the final photoresist topography contours after exposure by the image and development with a developer solution in any lithography process model, which can be a main feature model or a printing model.

A photoresist model predicts a physical structure of a photoresist. A photoresist model is derived from a physical, mechanistic description of the chemical response of a photoresist to light exposure and chemical development processes. In one embodiment of the present disclosure, the photoresist model can be employed to perform operations with a set of pre-defined basis functions on an aerial image, which is taken as an input for the photoresist model. These basis functions can use parameters that have been previously calibrated. Each operation can be, for instance, in the form of performing the convolution between the aerial image intensity distribution and a Gaussian function at every point of the aerial image over the simulation plane, where the standard deviation parameter of the Gaussian function has been previously determined during calibration. After that, all the results from said operations are combined together according to a predefined polynomial equation. Each term of this polynomial is the result of one of the operations performed on the aerial image with those basis functions, multiplied by a coefficient that has also been previously calibrated. The final result of applying this polynomial to the aerial image is a set of contours representing the top-down view of the developed photoresist topography.

As used herein, a "focus" refers to the height of a wafer stage during lithographic exposure. A focus can be defined relative to the plane of best focus plane, which is the height of the wafer stage in the scanner at which the image and, therefore photoresist contours, are sharpest.

As used herein, a "defocus" refers to the deviation of the focus from a best focus plane.

As used herein, a "dose" refers to the amount of energy exposed over a photoresist layer on a wafer, with energy being a function of the exposure time (i.e., energy=intensity×time). A dose can be defined relative to the value of a best dose, at which the photoresist line-widths are equal to the target line-width value.

A lithographic process can be characterized by a combination of a focus and a dose values. This combination is also referred to as "focus and dose conditions," "exposure focus and dose conditions," or "lithographic exposure focus and dose conditions", or "lithographic exposure conditions".

As used herein, "nominal dose and focus conditions" refer to the combination of a nominal dose and a nominal focus that is known to be optimal for the purpose of replicating intended patterns from a lithographic mask on a photoresist layer.

As used herein, a "printing model" is a model for predicting whether a feature in a lithographic mask would be transferred to a photoresist layer under selected lithographic exposure conditions. A printing model can be embodied as a set of equations and methods of applying the set of equations such that the computed result is a prediction of whether a feature, which is present in a lithographic mask would be transferred into a photoresist layer or not. A printing model provides at least a binary result, i.e., presence or absence of a printed image. A printing model does not need to predict accurate linewidth values. However, a printing model may be calibrated using more data and more advanced models to give an accurate printing linewidth value.

The printing model can predict whether and under which lithographic conditions sub-resolution assist features on the photomask will physically print on the wafer. An SRAF can be printed, for example, as a small indentation that starts to appear on the surface of a photoresist layer a consequence of the use of SRAFs, i.e., due to the presence of the SRAFs within the lithographic mask. The printing model can include both an optical model and a photoresist model, which are herein referred to as a printing optical model and a printing photoresist model, respectively.

Full-chip compatible main features models do not usually provide adequate accuracy in predicting SRAF printing, that is, in predicting marginal indentations of the photoresist surface or resist bumps which do not resolve through the photoresist depth and are not included in the calibration of main feature models.

A printing model can predict the contours of the photoresist topography after a photoresist material in a photoresist layer has been exposed to an image from a scanner and developed with a developer solution. The printing optical model can be used to compute the aerial image intensity distribution that results from the light diffracted by a lithographic mask (which contains resolvable and sub-resolution assist features), and projected onto the photoresist coated wafer by the lithography scanner lens system. The printing model can be used to predict the linewidths in a photoresist layer of main features.

As used herein, "calibration" refers to the process of providing a set of at least one new value for one or a the set of parameters and/or coefficients of the lithographic equations comprising a lithography process model such that an output of the lithographic equations minimizes a pre-defined error metric, and/or to the process of verifying a set of at least one pre-existing value for various parameters and/or coefficients of lithographic equations in a lithography process model to confirm that an output of the lithographic equations minimizes a pre-defined error metric. This error metric can include a weighted subtraction between simulated and measured characteristics of a lithographic process. Simulated or measured characteristics of a lithographic process can include, but are not limited to, linewidths in a developed photoresist layer, spaces in a developed photoresist layer, a best focus plane, and an image plane.

As used herein, a "transmission coefficient" is a scalar multiplier that is multiplied to a quantity representing a component of illumination passing through an SRAF to reflect the electromagnetic field (EMF) effect of the SRAF, which would be otherwise ignored in two-dimensional simulations.

According to an embodiment of the present disclosure, a phase shift value and optionally a transmission coefficient are assigned to each SRAF in multiple test patterns as a way to accurately predict the printing characteristics of each combination of a main feature and at least one SRAF without excessive increase in the run time during a simulation. The combination of a phase shift value and a transmission coefficient for an SRAF is herein referred to as a "phase transmission value" for the SRAF. The phase shift associated with each SRAF changes the optical behavior of illuminating radiation in a printing model. The values for the phase shift to be employed in the printing model can be determined by matching predicted SRAF printing and predicted main feature focus offset with measured data from patterned photoresist layers generated from the test patterns. Once the values of the phase shifts for the SRAFs are determined for the printing model, the printing model can correctly predict the SRAF printing and main feature focus offset from an arbitrary design mask on which a simulation is performed.

With the use of phase shift values, and optionally transmission coefficient values, in the printing model, a thin mask approximation (in which the thickness of the mask is assumed to be zero) and a two-dimensional model for photoresist pattern simulation can still be used according to an embodiment of the present disclosure. Use of the two-dimensional model provides fast computation. Further, nominal (or close to nominal) dose can be used, thereby minimizing deleterious effects on main feature printing. Instead of calibrating a separate two-dimensional or a three-dimensional photoresist model, the phase shift values can be calibrated to provide a printing model, which can be employed to predict SRAF printing and defocus behavior based on through-process data. The optimal phase shift values can be applied to SRAFs in a standard data preparation flow that applies optical proximity correction (OPC) or optical rule-based correction (ORC) employing rule-based or model-based SRAF placement schemes.

The phase shift and the transmission coefficient can be modified for each SRAF during optical simulation and photoresist simulation to correctly predict SRAF printing at the top, and/or the bottom, of a photoresist layer, and/or to calculate the shift in best focus plane for the main features induced by the SRAF electromagnetic field (EMF) effects.

The phase transmission values applied the SRAFs are determined based on a calibration flow illustrated in the flow chart of FIG. 1. During the calibration flow, a plurality of SRAF test patterns can be measured through various focus and/or dose conditions to determine a best focus offset and/or SRAF printing conditions, i.e., conditions in which SRAF printing occurs. For each test pattern, the phase shift value, and optionally the transmission coefficient, necessary for correctly predicting the best focus offset and/or the SRAF printing conditions are determined by simulating the structures that correspond to the test patterns through a range of phase values. The simulation can be performed employing a printing model in which initial values are provided (e.g., as zero) for each of the phase shift values. Further, the initial values for the transmission coefficient can also be provided in the printing model for the purpose of simulation. These phase shift values that best replicate the measured data can be tabulated, and provided as a set of optimized parameter values for the printing model.

Referring to step 110 of FIG. 1, illumination conditions for a lithographic exposure process to be employed in an exposure tool is selected. Illumination conditions depend on the exposure tool, which is an optics system into which a lithographic mask is to be mounted.

Figure 2:
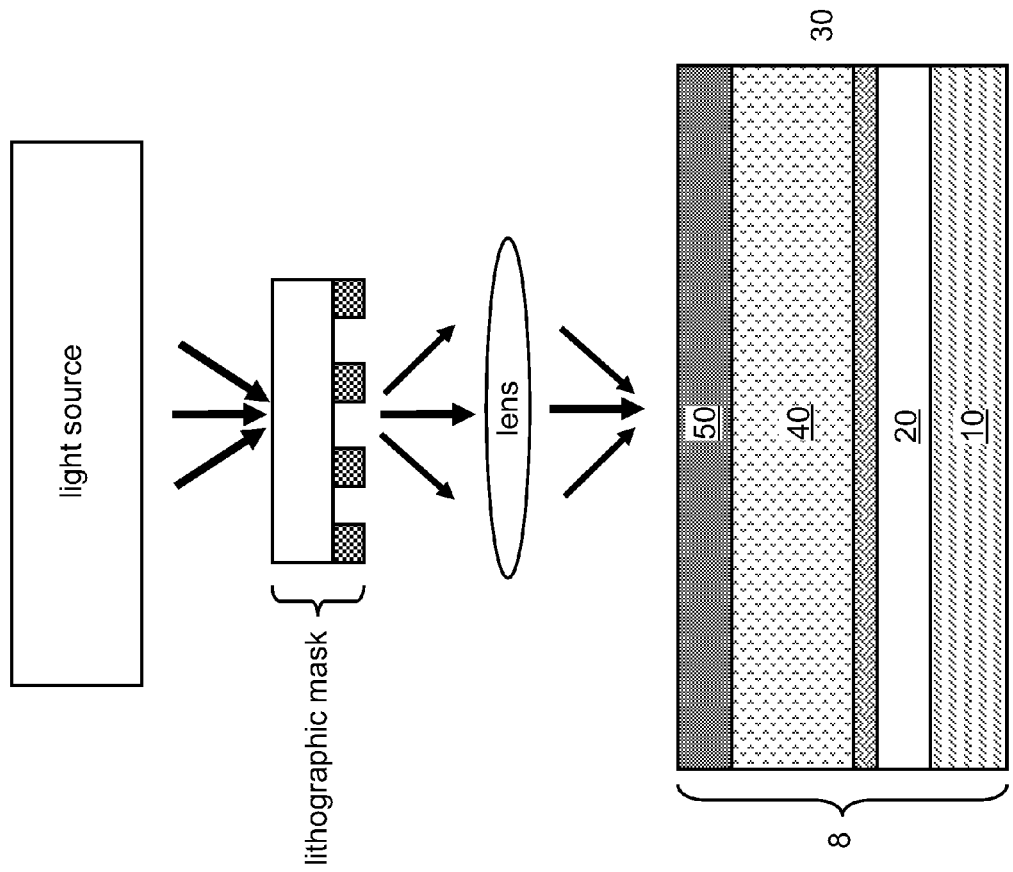
FIG. 2 is a schematic diagram illustrating an optics system and a lithographic material stack.

FIG. 2 illustrates an optics system and a lithographic material stack 8. The lithographic material stack 8 includes, from bottom to top, a substrate 10, an underlayer 20 that is subsequently deposited on the substrate 10 and including at least one of a semiconductor material, a conductive material, and an insulator material, a bottom antireflective coating (BARC) layer 30, a photoresist layer 40, and a top antireflective coating (TARC) layer 50. The lithographic mask includes physical shapes corresponding to the design to be transferred to the photoresist layer 40 on the substrate 10, which can be a wafer as known in the art. The illumination conditions include, among others, polarization of the illumination beam, a source mask pattern, and the optics of the lens system.

Referring to step 120 of FIG. 1, a test mask including multiple test patterns is provided. Each test pattern includes a combination of a main feature and at least one sub-resolution assist feature (SRAF). Each test pattern is defined by a combination of a main feature, at least one SRAF applied to the main feature, and the geometrical relationship between the main feature and the at least one SRAF. For each main feature, multiple sets of at least one SRAF and/or multiple types of geometry between the main feature and the at least one SRAF can be provided in the test pattern.

Figure 3:
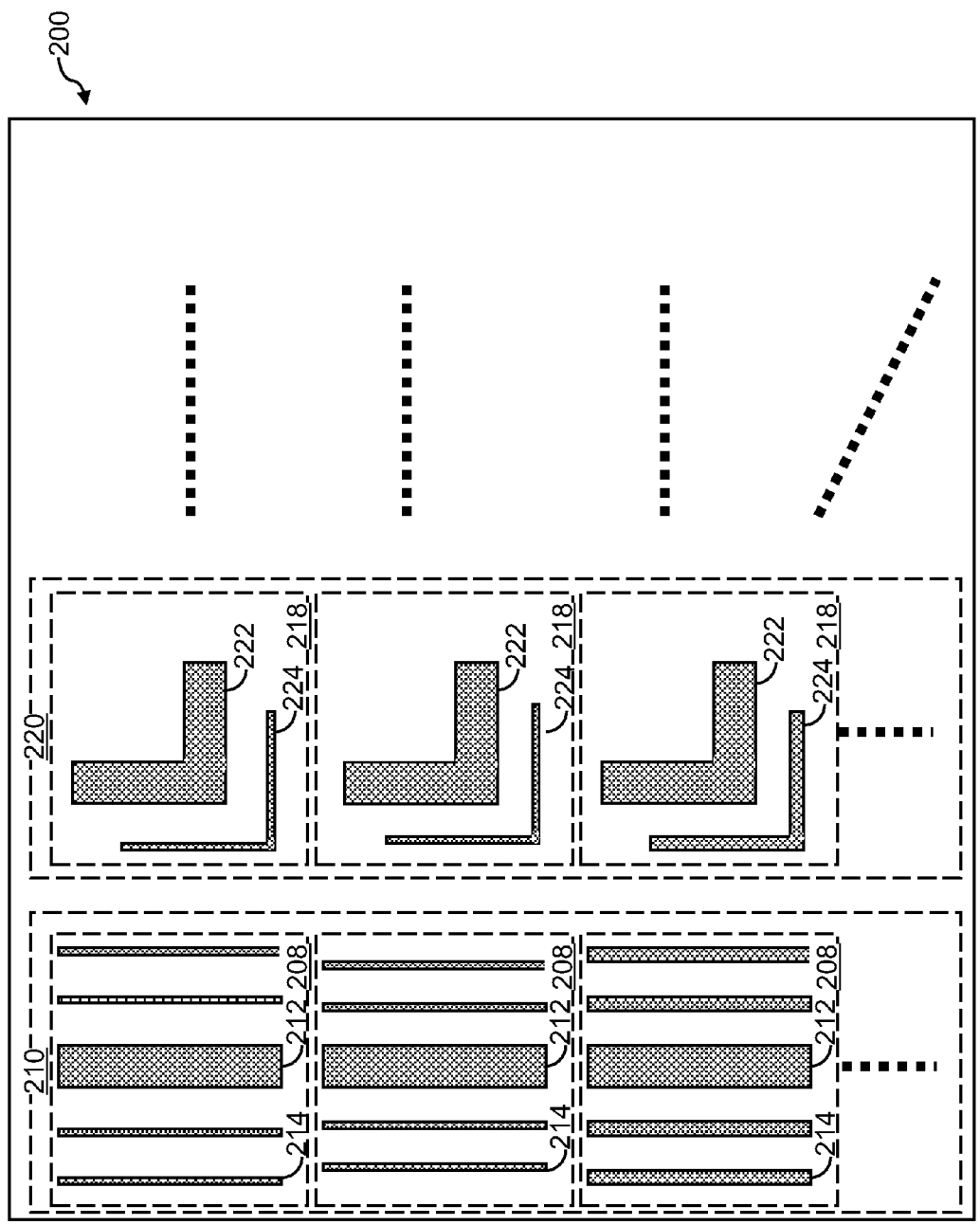
FIG. 3 is an exemplary design pattern for a test mask including combinations of a main feature and SRAFs according to an embodiment of the present disclosure.

Referring to FIG. 3, an exemplary lithographic mask 200 includes multiple sets of test patterns. Each set (210, 220) can include multiple test patterns each including a same main feature (212, 222) and differing from one another by the at least one SRAF (214, 224). In one embodiment, the plurality of combinations can include at least one combination of a single main feature and a plurality of SRAFs such as first-type test patterns 208. In one embodiment, the plurality of combinations includes at least one combination of a single main feature and a single SRAF such as second-type test patterns 218.

For example, a first set 210 includes first-type test patterns 208. Each first-type test pattern 208 includes a first main feature 212 and different first SRAFs 214. The first main feature 212 is the same across all first-type test patterns 208. The first SRAFs 214 belonging to different first-type test patterns 208 differ from one another by the shape(s) of the first SRAFs 214, and/or by the geometrical relationship between the first main feature 212 and the first SRAFs 214. Likewise, a second set 220 includes second-type test patterns 218. Each second-type test pattern 218 includes a second main feature 222 and a different second SRAF 224. The second main feature 222 is the same across all second-type test patterns 218. The second SRAF 224 belonging to different second-type test patterns 218 differ from one another by the shape of the second SRAF 224, and/or by the geometrical relationship between the second main feature 222 and the second SRAF 224. The exemplary lithographic mask 200 can include N different sets of test patterns corresponding to N different main feature. The number N can be in a range from 2 to 1,000,000, although greater numbers for N can also be employed. For each number i between 2 and (N+1), an i-th set of test patterns can include a plurality of i-th-type test patterns. Each i-th type test pattern includes an i-th main feature and at least one i-th SRAF. The i-th main feature is the same across all i-th-type test patterns. The at least one i-th SRAF belonging to different i-th-type test patterns differ from one another by the shape(s) of the i-th SRAFs 214, and/or by the geometrical relationship between the i-th main feature and the at least one i-th SRAF.

In an ideal case, the shapes of each main feature (212, 222) are intended to be physically manifested in a developed photoresist, and the shapes of the SRAFs (214, 224) are intended not to be physically manifested in the developed photoresist. However, the shapes of the SRAFs (214, 224) can be manifested outside a narrow processing window for a combination of focus and dose conditions, or even at an optimal setting for the combination of focus and dose conditions if the shapes of the SRAFs (214, 224) are not optimized.

Referring to step 130 of FIG. 1, a plurality of lithographic material stacks 8 (See FIG. 2) are employed to lithographically expose and develop a photoresist layer 40. The selected illumination condition is employed for lithographic exposure of the photoresist layer 40 within each lithographic material stack 8. Depending on the polarity of the material of the photoresist layer 40, lithographically exposed portions or unexposed portions of the photoresist layer 40 are removed in each lithographic material stack 8 during the development step, thereby generating a developed photoresist layer. Each developed photoresist layer is the patterned photoresist layer that includes lithographically replicated patterns derived from the test patterns in the test mask.

The various photoresist layers are lithographically exposed at different focus conditions employing the test mask, and are subsequently developed. In one embodiment, the various photoresist layers can be lithographically exposed at different dose conditions and different focus conditions. For example, a matrix of dose conditions and focus conditions can be generated, and the photoresist layer can be lithographically exposed employing the dose and focus conditions in the matrix. In one embodiment, a first subset of photoresist layers can be lithographically exposed at a first dose and at various focus conditions, a second subset of photoresist layer can be lithographically exposed at a second dose and at various focus condition, etc.

Referring to step 140 of FIG. 1, printed feature dimensions corresponding to each main feature (212, 222; See FIG. 3) are measured in each developed photoresist layer. Further, presence or absence of any printed SRAF in each developed photoresist layer can be measured.

Measurement of the printed feature dimensions in the developed photoresist layers can be performed by critical dimension (CD) measurement tools known in the art. Further, detection of any printed SRAF in the developed photoresist layers can be performed employing a commercially available scanning electron microscope (SEM) tools. In one embodiment, the SEM tool can take images of printed SRAFs and analyze the geometrical features of the printed SRAFs. Measured features of printed SRAFs can include, for example, presence or absence of any printed SRAF at each combination of a dose condition and a focus condition, area of each printed SRAF, a maximum dimension of each printed SRAF, a width of each SRAF, and a depth or a height of each printed SRAF as physically manifested on the developed photoresist layers.

Referring to step 152, for each combination of a main feature and at least one SRAF in the test pattern, measured feature dimensions for a corresponding printed feature dimension can be tabulated for each dose condition as a function of focus within the different focus conditions employed to lithographically expose the photoresist layers. In one embodiment, for each combination of a main feature and at least one SRAF in the test pattern, measured feature dimensions for a corresponding printed feature dimension can be tabulated as a function of dose and focus within the different dose conditions and the different focus conditions employed to lithographically expose the photoresist layers.

Referring to step 154, the parameters in the printing model can be fitted by iteratively running simulations on the print model while floating the parameters for a selected combination of a main feature and at least one SRAF. Specifically, for each selected combination of a main feature and at least one SRAF, at least one phase transmission value in the printing model that is associated with the selected combination can be fitted by iteratively running simulations on the print model while floating the at least one phase transmission value. The at least one phase transmission value includes at least one of a phase shift value and a transmission coefficient. For example, for each of at least one SRAF (e.g., 214 or 224; See FIG. 3) in a selected combination of a main feature and at least one SRAF, a phase shift value and/or a transmission coefficient for each of the selected at least one SRAF in the printing model can be fitted by iteratively running simulations on the print model while floating the phase shift value and/or the transmission coefficient. As used herein, to "float" a scalar means to treat the scalar as a variable.

The printing model with a floating value for the at least one phase transmission value for each SRAF within a selected combination of a main feature and at least one feature is fitted employing the data generated at step 140, i.e., the compiled data on the measured printed feature dimensions and/or on the measured features of corresponding printed SRAFs as generated from the plurality of lithographically exposed and developed photoresist layer at different dose and focus conditions. Specifically, a subset of data from the compiled data on the measured printed feature dimensions pertaining to the selected combination of a main feature and at least one feature is employed to fit the printing model while the at least one phase transmission value for each SRAF within the selected combination is treated as a floating variable. Each simulation employing the printing model generates a set of simulated printed feature dimensions and simulated SRAF images.

Figure 4A:
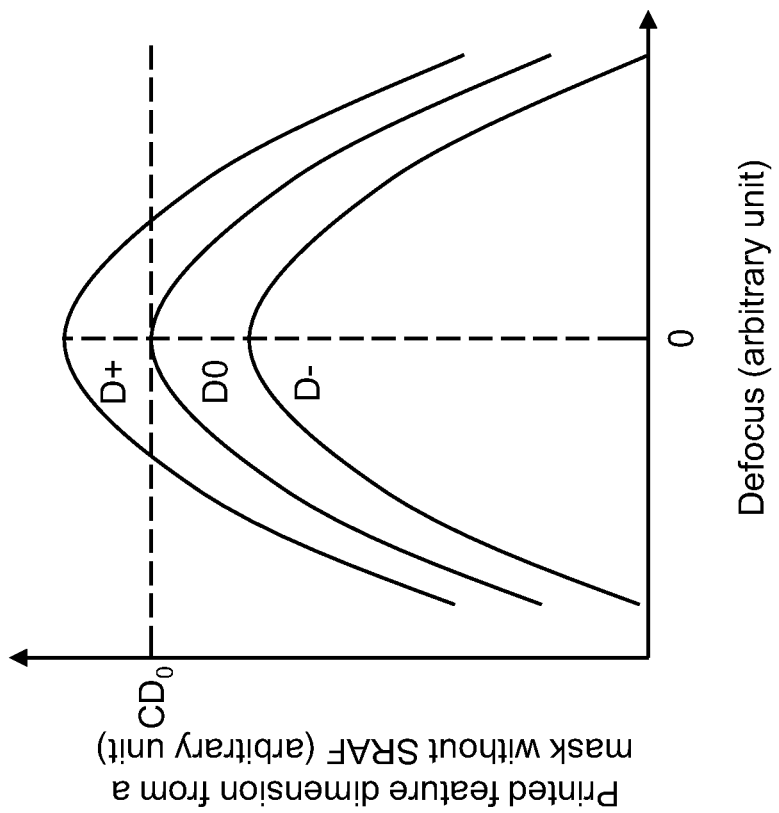
FIG. 4A is a graph illustrating printed feature dimensions from a lithographic mask that does not include SRAFs as a function of defocus.
Figure 4B:
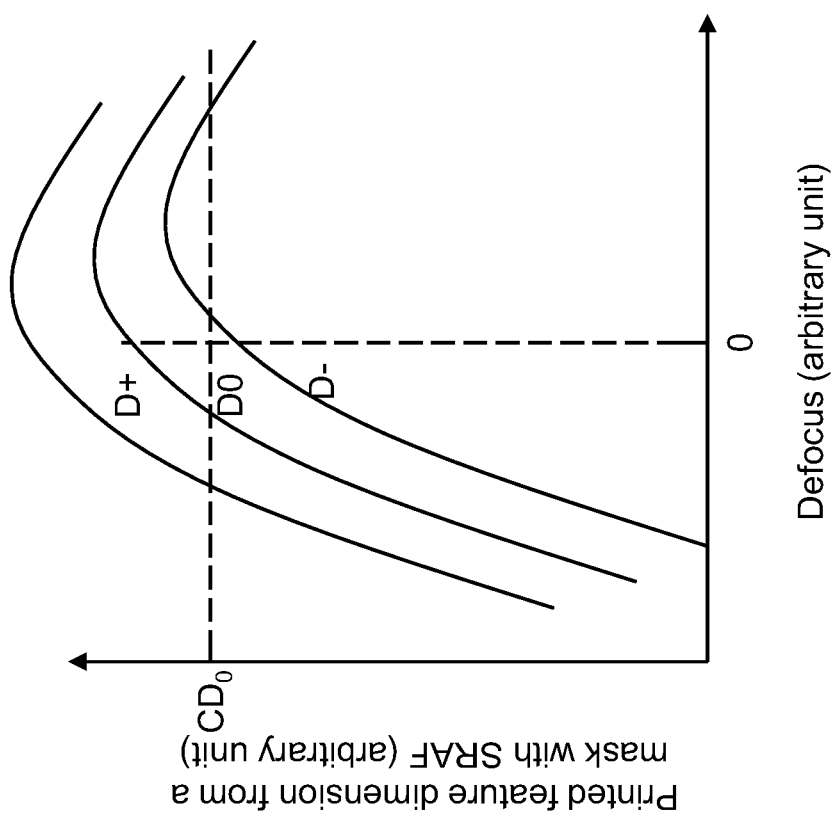
FIG. 4B is a graph illustrating printed feature dimensions from a lithographic mask that includes SRAFs as a function of defocus.

The effect of the presence of at least one SRAF in proximity to a main feature is illustrated in FIGS. 4A and 4B. FIG. 4A is a graph illustrating printed feature dimensions from a lithographic pattern that does not include any SRAF as a function of defocus and lithographic dose. D0 represents a nominal dose. Depending on the polarity of the lithographic mask and the photoresist, D+ can represent a greater-than-nominal dose and D− can represent a less-than-nominal dose, or vice versa. $CD_0$ refers to a nominal printed feature dimension at a nominal focus and a nominal focus in case no SRAF is employed to print the main feature.

FIG. 4B is a graph illustrating printed feature dimensions from a lithographic mask that includes SRAFs as a function of defocus. Use of the SRAFs causes a change in the optimum focus and/or the optimum dose. Further, the functional dependency of the printed feature dimension on defocus changes as a function of the dose condition. Thus, the functional dependency of measured printed feature dimensions from the plurality of developed photoresist layers can be employed to perform simulations on the print model with floating parameters, and to determine the optimum values for the floating parameters, which can be the at least one phase transmission value for each SRAF.

The simulations can continue until simulated values, as generated from the print model, for a printed feature dimension for the selected main feature match corresponding measured feature dimensions from the developed photoresist layers. After running a sufficient number of convergent simulations, the result of a simulation is selected, which best matches the subset of data from the compiled data on the measured printed feature dimensions pertaining to the selected combination of a main feature and at least one feature. The assigned values for the at least one phase transmission value for each SRAF in the selected combination are saved as the best-fit values for the at least one phase transmission value for the corresponding SRAF.

By repeating the above procedure for each SRAF in the test mask, a table of at least one phase transmission value can be generated for all SRAFs in the test mask. The table can include a table of a phase shift value for all SRAFs in the test mask, and/or a table of a transmission coefficient for all SRAFs in the test mask.

In parallel with performing steps 152 and 154, or instead of performing steps 152 and 154, steps 162 and 164 can be performed. Referring to step 162 of FIG. 1, for each combination of a main feature and at least one SRAF in the test pattern, any measured features of corresponding printed SRAFs can be tabulated for each dose condition as a function of focus within the different focus conditions employed to lithographically expose the photoresist layers. In one embodiment, for each combination of a main feature and at least one SRAF in the test pattern, any measured features of corresponding printed SRAFs can be tabulated as a function of dose and focus within the different dose conditions and the different focus conditions employed to lithographically expose the photoresist layers.

Referring to step 164, the parameters in the printing model can be fitted by iteratively running simulations on the print model while floating the parameters for a selected combination of a main feature and at least one SRAF. Specifically, for each selected combination of a main feature and at least one SRAF, at least one phase transmission value in the printing model that is associated with the selected combination can be fitted by iteratively running simulations on the print model while floating the at least one phase transmission value. The at least one phase transmission value includes at least one of a phase shift value and a transmission coefficient. For example, for each of at least one SRAF (e.g., 214 or 224; See FIG. 3) in a selected combination of a main feature and at least one SRAF, a phase shift value and/or a transmission coefficient for each of the selected at least one SRAF in the printing model can be fitted by iteratively running simulations on the print model while floating the phase shift value and/or the transmission coefficient.

The printing model with a floating value for the at least one phase transmission value for each SRAF within a selected combination of a main feature and at least one feature is fitted employing the data generated at step 140, i.e., the compiled data on the measured printed feature dimensions and/or on the measured features of corresponding printed SRAFs as generated from the plurality of lithographically exposed and developed photoresist layer at different dose and focus conditions. Specifically, a subset of data from the compiled data on the measured features of corresponding printed SRAFs pertaining to the selected combination of a main feature and at least one feature is employed to fit the printing model while the at least one phase transmission value for each SRAF within the selected combination is treated as a floating variable. Each simulation employing the printing model generates a set of simulated printed feature dimensions and simulated SRAF images.

The simulations can continue until simulated values, as generated from the print model, representing feature dimensions of printed SRAFs for the selected main feature match corresponding measured feature dimensions of printed SRAFs from the developed photoresist layers. After running a sufficient number of convergent simulations, the result of a simulation is selected, which best matches the subset of data from the compiled data on the measured feature dimensions of printed SRAFs pertaining to the selected combination of a main feature and at least one feature. The assigned values for the at least one phase transmission value for each SRAF in the selected combination are saved as the best-fit values for the at least one phase transmission value for the corresponding SRAF.

By repeating the above procedure for each SRAF in the test mask, a table of at least one phase transmission value can be generated for all SRAFs in the test mask. The table can include a table of phase shift values for all SRAFs in the test mask, and/or a table of transmission coefficients for all SRAFs in the test mask. In one embodiment, the table can include a first table of phase shift values for all SRAFs in the test mask, and a second table of transmission coefficients for all SRAFs in the test mask.

With each simulation, the table of phase transmission values can be expanded, revised, modified, and/or amended to provide consistency among the various phase transmission values for the SRAFs in each of steps 154 and 164. Referring to step 170, any conflict among the phase transmission values arising from the table from step 154 and the table from step 164 is resolved. The resolution of the conflict may be effected, for example, by weighting the table from step 154 and the table from step 164 with equal or different weights, and generating a new table based on the weighted average of the values from the two tables from steps 154 and 164. Alternatively, additional simulations can be performed to simultaneously optimize floating values for the phase transmission values employing the data for measured printed main feature dimensions and measured features of printed SRAFs to resolve conflicts from the two tables from step 154 and step 164. Yet alternatively, additional statistical methods may be optionally employed to resolve conflicts between the two tables from step 154 and step 164. Still alternatively, only the sequence of steps 152 and 154 may be performed without performing steps 162 and 164, or only the sequence of steps 162 and 164 may be performed without performing steps 152 and 154, which obviates the need to resolve any conflicts. In this case, step 170 may be skipped. Thus, a table including finalized values for the phase transmission values can be generated at step 170 as needed. The finalized table can include a table of phase shift values for all SRAFs in the test mask, and/or a table of transmission coefficients for all SRAFs in the test mask.

Referring to step 180, the finalized phase transmission values for each SRAF type is encoded into the printing model, which is a model for optical simulation. In general, the finalized phase transmission values for each SRAF type can be encoded into a data preparation program.

In one embodiment, the phase transmission values for the SRAFs can depend on each combination of a main feature and at least one SRAF. In other words, the phase transmission values are specific to each combination of the main feature and the at least one SRAF. In one embodiment, each of the phase shift values can depend on a geometrical relationship between a corresponding main feature and a corresponding SRAF. In one embodiment, each of the phase shift values depends on the shape of a corresponding SRAF.

Referring to step 190, a model for optical simulation can be generated employing the table generated from steps 154, 164, or 170. The table provides the values for the phase shift values and/or transmission coefficients, and renders the printing model operable. The optical model includes the printing model and the table of phase shift values and/or transmission coefficients.

Once the model for optical simulation is provided, an arbitrary design layout may be provided for simulation. An optical simulation can be run on the design layout employing the model for optical simulation of the present disclosure.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of generating a model for optical simulation, said method comprising:
   providing a test mask including multiple test patterns therein, each of said multiple test patterns including a combination of a main feature and at least one sub-resolution assist feature (SRAF);
   lithographically exposing, employing said test mask, photoresist layers at different focus conditions and subsequently developing said photoresist layers;
   measuring printed feature dimensions of said test pattern on said developed photoresist layers;
   generating a table including a phase transmission value for each SRAF in said test pattern by fitting a printing model with said printed feature dimensions; and
   generating a model for optical simulation, said model including said printing model and said table of phase transmission values.

2. The method of claim 1, wherein said phase transmission values depend on each combination of said main feature and said at least one SRAF.

3. The method of claim 1, wherein each of said phase transmission values depends on a geometrical relationship between a corresponding main feature and a corresponding SRAF.

4. The method of claim 1, wherein each of said phase transmission values depends on a shape of a corresponding SRAF.

5. The method of claim 1, further comprising tabulating, for each combination of a main feature and at least one SRAF in said test pattern, measured feature dimensions for a corresponding printed feature dimension as a function of focus within said different focus conditions.

6. The method of claim 5, wherein said fitting of said printing model comprises iteratively running simulations on said print model while floating a phase transmission value for a selected combination of a main feature and at least one SRAF until simulated values, as generated from said print model, for a printed feature dimension for said selected main feature match corresponding measured feature dimensions from said developed photoresist layers.

7. The method of claim 1, further comprising compiling, for each combination of a main feature and at least one SRAF in said test pattern, manifestation of at least one corresponding printed SRAF as a function of focus within said different focus conditions.

8. The method of claim 7, wherein said fitting of said printing model comprises iteratively running simulations on said print model while floating a phase transmission value for a selected combination of a main feature and at least one SRAF until simulated manifestation of at least one corresponding printed SRAF, as generated from said print model, matches manifestation of said at least one corresponding printed SRAF on said developed photoresist layers.

9. The method of claim 1, further comprising:
   lithographically exposing, employing said test mask, additional photoresist layers at different dose conditions and subsequently developing said additional photoresist layers;
   measuring additional printed feature dimensions of said test pattern on said additional developed photoresist layers; and
   modifying said table by fitting said printing model with said additional printed feature dimensions.

10. The method of claim 9, further comprising tabulating, for each combination of a main feature and at least one SRAF in said test pattern, measured feature dimensions for a corresponding printed feature dimension as a function of dose and focus within said different dose conditions and said different focus conditions.

11. The method of claim 10, wherein said fitting of said printing model comprises iteratively running simulations on said print model while floating a phase transmission value for a selected combination of a main feature and at least one SRAF until simulated values, as generated from said print model, for a printed feature dimension for said selected main feature match corresponding measured feature dimensions from said developed photoresist layers.

12. The method of claim 9, further comprising compiling, for each combination of a main feature and at least one SRAF in said test pattern, manifestation of at least one corresponding printed SRAF as a function of dose and focus within said different dose conditions and said different focus conditions.

13. The method of claim 12, wherein said fitting of said printing model comprises iteratively running simulations on said print model while floating a phase transmission value for a selected combination of a main feature and at least one SRAF until simulated manifestation of at least one corresponding printed SRAF, as generated from said print model, matches manifestation of said at least one corresponding printed SRAF on said developed photoresist layers.

14. The method of claim 1, further comprising generating a second table including a transmission coefficient for each SRAF in said test pattern by fitting said printing model with said printed feature dimensions.

15. The method of claim 14, further comprising incorporating said second table for transmission coefficients into said model for optical simulation.

16. The method of claim 14, further comprising tabulating, for each combination of a main feature and at least one SRAF in said test pattern, measured feature dimensions for a corresponding printed feature dimension as a function of focus within said different focus conditions.

17. The method of claim 16, wherein said fitting of said printing model comprises iteratively running simulations on said print model while floating a transmission coefficient for an SRAF in a selected combination of a main feature and at least one SRAF until simulated values, as generated from said print model, for a printed feature dimension for said selected main feature match corresponding measured feature dimensions from said developed photoresist layers.

18. The method of claim 14, further comprising compiling, for each combination of a main feature and at least one SRAF in said test pattern, manifestation of at least one corresponding printed SRAF as a function of focus within said different focus conditions.

19. The method of claim 18, wherein said fitting of said printing model comprises iteratively running simulations on said print model while floating a transmission coefficient for an SRAF in a selected combination of a main feature and at least one SRAF until simulated manifestation of at least one corresponding printed SRAF, as generated from said print model, matches manifestation of said at least one corresponding printed SRAF on said developed photoresist layers.

20. A method of performing an optical simulation on a design layout, said method comprising:
   providing a model for optical simulation employing a method of claim 1;
   providing a design layout; and
   running an optical simulation on said design layout employing said model for optical simulation.

* * * * *